(12) United States Patent
Hartl

(10) Patent No.: US 12,666,552 B2
(45) Date of Patent: Jun. 23, 2026

(54) HOUSING PART FOR ATTACHMENT TO A HOUSING AND ELECTRIC COMPRESSOR

(71) Applicant: Schott AG, Mainz (DE)

(72) Inventor: Helmut Hartl, Klosterneuburg (AT)

(73) Assignee: SCHOTT AG, Mainz (DE)

( * ) Notice: Subject to any disclaimer, the term of this patent is extended or adjusted under 35 U.S.C. 154(b) by 170 days.

(21) Appl. No.: 18/093,651

(22) Filed: Jan. 5, 2023

(65) Prior Publication Data

US 2023/0156937 A1 May 18, 2023

Related U.S. Application Data

(63) Continuation of application No. PCT/EP2021/068201, filed on Jul. 1, 2021.

(30) Foreign Application Priority Data

Jul. 6, 2020 (EP) ..................................... 20184235

(51) Int. Cl.
*H05K 5/02* (2006.01)
(52) U.S. Cl.
CPC ......... *H05K 5/0217* (2013.01); *H05K 5/0247* (2013.01)
(58) Field of Classification Search
CPC .... H05K 5/0217; H05K 5/0247; H01R 13/03; H01R 13/40; H01R 13/52; H01R 13/74; H01R 13/5202
USPC ...... 174/152 GM, 650, 657–660, 50.5, 50.3; 439/278, 282, 680, 911, 935; 361/807–810
See application file for complete search history.

(56) References Cited

U.S. PATENT DOCUMENTS

| | | | |
|---|---|---|---|
| 4,964,788 A | 10/1990 | Itameri-Kinter et al. | |
| 5,584,716 A | * 12/1996 | Bergman ........... | H01R 13/5202 |
| | | | 439/282 |
| 6,841,731 B1 * | 1/2005 | Zanello ..................... | H01J 5/36 |
| | | | 174/50.56 |

(Continued)

FOREIGN PATENT DOCUMENTS

| | | |
|---|---|---|
| CN | 102013581 A | 4/2011 |
| EP | 2 218 915 A1 | 8/2010 |

(Continued)

OTHER PUBLICATIONS

Notification of Transmittal of the International Search Report and the Written Opinion of the International Searching Authority, or the Declaration dated Aug. 5, 2021 for International Application No. PCT/EP2021/068201 (13 pages).

*Primary Examiner* — Tuan T Dinh
(74) *Attorney, Agent, or Firm* — TAYLOR & EDELSTEIN, PC

(57) ABSTRACT

A housing part for attachment to a housing includes: at least one opening for at least one conductor embedded in a glass or a glass-ceramic material that is fed into the at least one opening providing a glass-metal seal (GTMS); an elevated area and/or a recess area configured to center the housing part within a structure of the housing and/or enhance the resilience against bending, the at least one opening being provided in the elevated area and/or the recess area, the elevated area and/or the recess area being situated in a glassing area plane; and at least two bores situated in a plane different from the glassing area plane.

20 Claims, 6 Drawing Sheets

(56)                     References Cited

U.S. PATENT DOCUMENTS

|  |  |  |  |  |
|---|---|---|---|---|
| 8,618,419 | B2 | 12/2013 | Fukasaku et al. | |
| 10,468,801 | B2 * | 11/2019 | Okuno | H01R 13/03 |
| 11,147,983 | B2 * | 10/2021 | Korpas | A61N 5/0619 |
| 11,417,983 | B2 * | 8/2022 | Fukushima | H02G 15/013 |
| 11,528,004 | B2 * | 12/2022 | Sahabi | A61N 1/37512 |
| 2007/0179553 | A1 * | 8/2007 | Iyer | A61N 1/3754 |
| | | | | 607/37 |
| 2012/0087811 | A1 | 4/2012 | Yamada et al. | |
| 2014/0093408 | A1 | 4/2014 | Adaniya et al. | |
| 2014/0099533 | A1 | 4/2014 | Hartl | |
| 2014/0111044 | A1 * | 4/2014 | Baumann | H01R 13/5208 |
| | | | | 174/59 |
| 2014/0168901 | A1 | 6/2014 | Ide et al. | |
| 2015/0083487 | A1 * | 3/2015 | Leedecke | C03C 3/00 |
| | | | | 174/659 |
| 2015/0116945 | A1 * | 4/2015 | Minamio | H01L 25/07 |
| | | | | 361/709 |
| 2016/0049781 | A1 | 2/2016 | Nisslbeck et al. | |
| 2018/0175533 | A1 * | 6/2018 | Li | H01R 13/24 |
| 2021/0234300 | A1 | 7/2021 | Fukushima et al. | |
| 2021/0344139 | A1 * | 11/2021 | Maegawa | F04B 39/123 |

FOREIGN PATENT DOCUMENTS

| | | |
|---|---|---|
| JP | 2014-214641 A | 11/2014 |
| KR | 10-2019-0094611 A | 8/2019 |
| WO | 2012/041472 A1 | 4/2012 |

* cited by examiner

HOUSING PART FOR ATTACHMENT TO A HOUSING AND ELECTRIC COMPRESSOR

CROSS REFERENCE TO RELATED APPLICATIONS

This application is a continuation of International Patent Application No. PCT/EP2021/068201 entitled "HOUSING PART, ESPECIALLY HOUSING PART IN PARTICULAR FOR AN ELECTRONIC HOUSING, PREFERABLY E-COMPRESSOR TERMINAL" filed on Jul. 1, 2021, which is incorporated in its entirety herein by reference. International Patent Application No. PCT/EP2021/068201 claims priority to European Patent Application No. 20184235.8 filed on Jul. 6, 2020, which is incorporated in its entirety herein by reference.

BACKGROUND OF THE INVENTION

1. Field of the Invention

The invention relates to a housing part, especially a housing component, in particular to be attached to a housing which accommodates an electronic compressor. The housing part can therefore be denoted as an e-compressor terminal. The housing part can be characterized as a feedthrough assembly. Further the invention also relates to an electric compressor comprising a housing part or a housing component as an e-compressor terminal according to the invention. The housing part, which is an e-compressor terminal, is attached to the housing of the e-compressor according to the invention by a fixing device, such as a screw which is fed through at least one bore in the housing part.

2. Description of the Related Art

Housings for electronic components may include a plurality of feedthroughs in order to guide wires from outside to the inner part of the housing, which accommodates e. g. parts of an electronic compressor in the housing. Housing parts comprising at least one conductor fed through an opening into a housing suffer from a low bending stiffness. Further the pressure resistance of housing parts according to the state of the art was low. The positioning of the housing parts, especially e-compressor terminals, have been difficult. Also the evenness and the sealing in the state of the art was defective, and their long-term reliability deserves improvement.

From WO 2012/041472 A1 a compressor with a housing part for the attachment to a housing with at least one opening is known. At least one conductor is embedded in a glass or a glass-ceramic material that is fed into each of the respective openings providing a glass-metal-seal. The housing part known from WO 2012/041472 A1 comprises at least two bores for fixing the housing part to the compressor. WO 2012/041472 A1 is silent how the resilience against bending of the housing part can be enhanced.

EP 2 218 915 A1 discloses a sealed type screw compressor with a rotor casing for a housing with a pair of a screw rotors. But EP 2 218 915 A1 does not discuss the problem of bending.

A close state of the art is KR 2019/0094611 A showing a housing part for a compressor with three conductors fed in a glass metal seal through the housing.

From KR 2019/0094611 A1 sealed feedthroughs of motor-driven compressors for supplying an electrical current from outside to an electric motor inside a sealed housing is known. In contrast to air conditioning systems used in an internal combustion engine, the air conditioning system in an electric vehicle has a great effect on the battery according to its efficiency and finally serves as a major factor in the car's range. An air-conditioning system of an internal combustion engine operates the compressor by using the waste heat of the engine. Since there is no combustion engine in an electric vehicle, the compressor must be operated separately using a motor. The most important components of the air conditioning system of the electric vehicle are an electrically driven electric compressor and a system capable of using eco-friendly new refrigerant while maintaining the efficiency of the compressor.

One of the key components of the compressor are sealed feedthroughs into the compressor housing, in which the compressor is situated to ensure airtightness under high temperature conditions and to connect power and signals. The compressors for electric vehicles are smaller than the existing compressors for combustion engines and are made of a hermetically sealed type to maintain high airtightness according to internal pressure. The only connection between the inside of the electric compressor and the external part is a feedthrough. A motor-driven electric terminal can be installed inside the compressor. The feedthrough from outside the compressor into the inside of the compressor is the most vulnerable part of an electric compressor.

In case of an electric compressor according to KR 2019/0094611 A1, the electrical energy must be guided from an inverter to an electric motor located inside the refrigerant circulation system, and the feedthroughs must be installed stably with regard to vibration, withstand pressure and electrically within the motor compressor housing.

In KR 2019/0094611 A1 not described is how the plate with the sealed feedthroughs can be attached in a tight manner to the housing especially the compressor housing. A further disadvantage of KR 2019/0064911 A1 is that due to a bending of the plate with the sealed feedthroughs, the glass or glass-ceramic material can break or cracks in the glass or glass-ceramic material can occur. From these breaks of the glass material a leakage of the e-compressor results.

Housing parts comprising at least one conductor fed through an opening into a housing according to the state of the art, especially KR 2019/0094611 A1, suffer from a low bending stiffness. Further the pressure resistance of housing parts according to the state of the art was low. The positioning of the housing parts, especially e-compressor terminals, has been difficult. Also the evenness and the sealing in the state of the art is defective, and their long-term reliability deserves improvement. The defectiveness of the evenness especially arises when a spigot is used for centering the housing component or the so called GTMS (glass-to-metal-seal) plate to a housing which accommodates the electric compressor and the spigot was situated in the center of the GTMS plate or the housing component. Further a problem in KR 2019/0094611 A1 was that the plane in which the glassing is made is also the plane with which the housing part or terminal plate is attached to the housing of the compressor. Therefore any bending due to the attachment results in a glass breakage of the feedthroughs.

What is needed in the art is a way to overcome the disadvantages of the state of the art. In particular, a housing part should be specified which is characterized by having a high stiffness and pressure resistance. Further an improved centering of the housing part, especially the glass metal plate comprising the feedthroughs to a housing with a high flatness should be possible. Further, a better connection of a plastic or rubber material with a metal should be provided. Any breakage of the glass material of the feedthroughs should be avoided.

SUMMARY OF THE INVENTION

In some exemplary embodiments provided according to the invention, a housing part for attachment to a housing includes: at least one opening for at least one conductor embedded in a glass or a glass-ceramic material that is fed into the at least one opening providing a glass-metal seal (GTMS); an elevated area and/or a recess area configured to center the housing part within a structure of the housing and/or enhance the resilience against bending, the at least one opening being provided in the elevated area and/or the recess area, the elevated area and/or the recess area being situated in a glassing area plane; and at least two bores situated in a plane different from the glassing area plane.

In some exemplary embodiments provided according to the invention, an electric compressor includes a housing part for attachment to a housing. The housing part includes: at least one opening for at least one conductor embedded in a glass or a glass-ceramic material that is fed into the at least one opening providing a glass-metal seal (GTMS); an elevated area and/or a recess area configured to center the housing part within a structure of the housing and/or enhance the resilience against bending, the at least one opening being provided in the elevated area and/or the recess area, the elevated area and/or the recess area being situated in a glassing area plane; and at least two bores situated in a plane different from the glassing area plane.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawing(s), wherein:

FIG. 6A1 is a cross-sectional view according to FIG. 6A with a mushroom shaped head part;

FIG. 6B1 is a side view of the housing part according to FIG. 6B;

FIG. 6B2 is a top view of the housing part according to FIG. 6B;

FIG. 10A1 is a 3D-view of the housing part of FIG. 6A;

FIG. 10A2 is another 3D-view of the housing part of FIG. 6A;

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
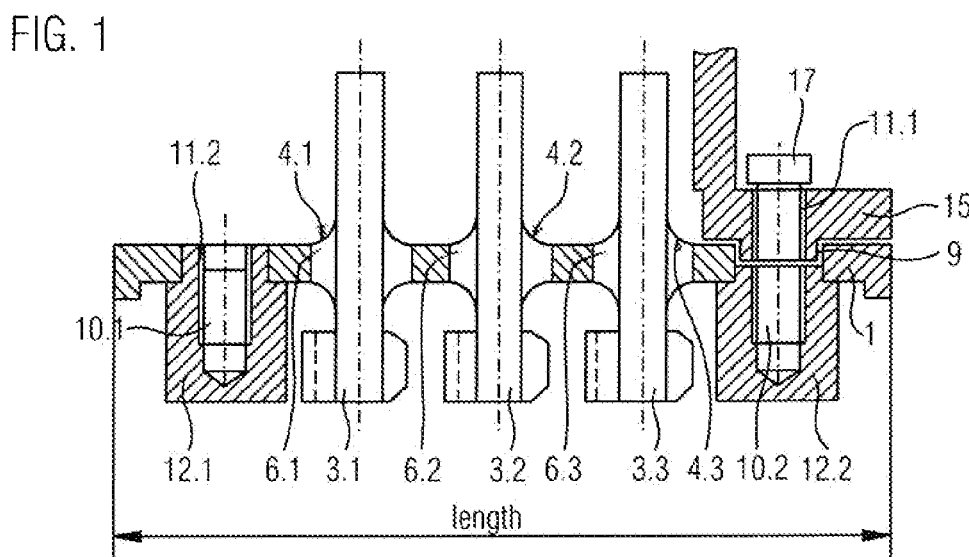
FIG. 1 is a cross-sectional view through a housing part in the form of an e-compressor terminal with three conductors and two bores provided according to the invention, with so-called screw bores for attaching the same to a housing.

In some exemplary embodiments provided according to the invention, a housing part includes at least one opening for at least one conductor embedded in a glass or a glass-ceramic material that is fed into each of the respective openings to provide a glass-metal seal (GTMS). The term GTMS also comprises glass-ceramic materials and the like. As generally known, those represent a group of inorganic materials which are capable of electrically insulating the conductor from the housing part and sealing the openings.

The housing part or housing component, in particular for a housing, optionally an e-compressor housing, can comprise a structure for centering the housing part at a structure of the housing to which the housing part is to be attached. Such structure for centering can be represented in some embodiments by an elevated and/or recess area. In some embodiments this can be a protrusion. According to the invention the housing part is affixed to the structure by screws in at least two bores, e.g. screw bores at the edge of the GTMS plate or housing part or e-compressor terminal. The housing part, which may be an e-compressor terminal provided according to the invention, furthermore comprises a structure for enhancing the housing parts resilience against bending or, in other words, enhances the stiffness of the housing part, especially the e-compressor terminal. This structure or structures for enhancing the housing parts' resilience against bending can be represented by at least one pulled up edge. Further, an elevated area and/or a recess area the stiffness and the sealing capabilities, especially the pressure resistance and/or long-term sealing reliability of the housing part can be significantly improved. In some embodiments, a pulled up edge can surround the complete edge of the housing part, e.g. the GTMS plate or only a part of the edge, e.g. the central part.

The enhancement of the stiffness, especially the bending stiffness which leads to a higher compression onto the glass or glass-ceramic material through which a conductor is fed into the housing part can be reached as follows:

providing the housing part with an elevated and/or recess area
  providing the housing part with a pulled up edge
  providing the elevated and/or recess area with the glassing in a different plane than the plane in which the housing part is affixed to the compressor housing e. g. by screws fed through bores.
  providing the housing part from a structural steel, especially a structural steel in form of a micro alloyed steel.

By the higher compression of the housing material, especially in the region of the opening for the feedthrough, a tight sealing can be provided. In order to provide the higher stiffness to the opening, at least one opening is provided in the elevated area and/or recess area. Optionally, all openings of the housing part are situated in the elevated and/or recess area. Further by providing the glassing plane to be different from the plane of the plate which is affixed to the compressor, breakage of the glass material due to bending can be avoided. In order to even better avoid bending, e.g. when the screws are through the fed bores and screwed down and/or screwed tight to affix the e-compressor terminal to the e-compressor housing, a flatness area e.g. by embossing, can be provided e.g. around the bores.

KR 2019/094611 A1 does not show the openings in an area which provide for a better bending stiffness and higher compression of the housing material onto the glass material and the conductor fed through the opening. Even further in KR 2019/094611 A1 the plane of the glassing in the openings of the housing part is equal to the plane in which the housing part is affixed to the compressor housing in contrast to exemplary embodiments provided according to the invention, where the two planes are different. A tight sealing according to this disclosure means that the helium leakage rate is lower than $10^{-7}$, optionally $10^{-8}$ mbar l/sec for a pressure difference of 1 bar. The structural steel which may be used comprises Ni, Nb, Ti, Al, V as alloy components. The stiffness is increased by 10 to 30% if such a material is used for the housing part. Structural steel is normally a carbon steel. If the stiffness can enhanced by one or more of the previously mentioned measurements, e.g. using a structural steel in form of micro-alloyed steel and/or providing a recess, then the thickness of the housing part can be reduced without the compression, e.g. onto a glass material of a feedthrough, being affected. The usage of micro-alloyed steel as material has several advantages. One further advantage beside the high stiffness is the fact that a body of micro-alloyed steel in contrast to normal structural steel has a lower weight. This is due to the fact that because of the high stiffness and yield strength of micro-alloyed steel, the wall thickness of the body can be reduced. The yield strength and therefore the stiffness of normal steel is reduced when, e.g. the conductor is brought in or glassed into a glass or glass-ceramic material due to the high temperature of this process. The yield strength of micro-alloyed steel is not so prominently reduced by high temperatures. Therefore, the yield strength and the stiffness of micro-alloyed steel is significantly higher after a temperature glassing process compared to that of a normal steel. The higher yield strength and therefore stiffness then can result in a higher compression of the metal onto the glass or glass-ceramic material. Furthermore, the higher yield strength and therefore stiffness may be advantageous for the housing part because it then can better withstand the pressure load from inside the housing onto which the housing part is mounted. A leaking between the housing part and the housing is prevented by the stiffer housing part.

The term structure in the meaning of this disclosure covers all means, especially all geometrical means, which are attached and/or formed-in at the housing part which is subject to the invention.

The previously mentioned advantages may be especially beneficial for an exemplary embodiment of the housing part, in which the housing part represents an elongated structure. This means that the housing part is longer than wide, for example multiple times longer than wide. This especially is the case for embodiments which comprise a plurality of openings, which means more than one opening. Such elongated structures are especially prone to bending issues.

In some embodiments, the elevated and/or recess area can be formed by using a stamping and/or reforming process. Thereby the housing part, specifically the base of the housing part, and the elevated and/or recess area are a one-piece part. Or in other words, the elevated and/or recess area are formed from the base of the housing part elevating over or under the plane of the base. This means that the elevated and/or recess area lies in a plane different from the plane of the base or the plate which is affixed to the compressor housing.

Such a production process is cheap and can be easily performed especially for a plate like housing part. The reforming and/or stamping has the further possible advantage that there is no bonding line between the base area and the recess area of the housing part, which could have effects on the long-term stability of the finished housing part. It has to be taken into account that especially in the e-compressor application, the housing part is exposed to temperature changes over a large interval of temperatures, temperature shocks and/or vibrations. Any existing mechanical connection between separate parts, in this case the base area or the area which is affixed to the compressor housing and the recess area, could induce mechanical stress and therefore also deformation into the recess area, which normally has the function to seal the housing to which the housing part is attached. Any deformation could lead to a loss of sealing capabilities and therefore might reduce the long-term reliability of the interconnection of the housing and the attached housing part. This is also due to breakage of the glass material which seals the feedthrough.

The elevated area represents a plane which is elevated from the plane of the base of the housing part. Thereby the elevated area has a side wall which extends from the base of the housing part. According to KR 2019/0094611 A1, the glassing lies in the plane of the base plate, whereas in the embodiments provided according to the invention with the elevated and/or recess area the glassing plane is different from the plane of the base plate. This has the possible advantage that glass cracks due to bending of the base plate can be avoided. In some embodiments, the transition of the base of the housing part and the side wall is rounded, optionally with a radius R. This helps to enhance the mechanical long term stability of the housing part, since the housing part is normally made of metal, and the rounded transition especially together with the one-piece design reduces the risk of the formation of initial cracks of the metal structure. The value of R can be dependent on the overall dimensions of the housing part. In a common application for an e-compressor, R may be between 0.01 mm and 0.8 mm.

It is foreseen and covered by the invention that the side wall can be perpendicular to the plane of the base of the housing part, but could also be in another angle or sloped, in order to be pressed in or to be even better centered into the structure of the housing to which the housing part is attached.

According to an exemplary embodiment provided according to the invention, the pulled up edge could be a separate part, which could be joined with the plate like element of the housing part by fusing. A possible advantage of the pulled up part being a separate part is that production of both parts—plate like element and pulled up part—could be organized separately. Because the pulled up edge is attached to the base part of the housing and therefore away from the sealing area, the line between the pulled up edge and the base of the housing part is assumed not to interfere with the long term sealing capabilities of the recess area as discussed previously.

However, in some embodiments, the housing part is reshaped in order to provide the pulled up edge. Such a reshaping process could be e.g. stamping the plate like element in order to provide a recess. This reforming and/or reshaping again leads to a one-piece part with all the advantages caused by the absence of a mechanical line as discussed above.

In some embodiments, the recess area has, at least at the side to be connected to the housing, especially of the e-compressor, a flatness according to DIN ISO 1101 of at least 0.1, optionally at least 0.07, optionally from 0.01 to 0.07. As discussed previously, the elevated and/or recess area serves to seal the housing from the environment. Therefore a good flatness can be achieved by the aforesaid structures, i.e. the elevated and/or recess area which represents a one-piece part and/or the pulled up edges. This aforementioned flatness is achieved during operations and a long term period of time. Therefore, the elevated and/or recess area and the pulled up edge can work together to achieve those beneficial behaviors. This also allows reducing the thickness of the housing part and thereby reducing the amount of material needed. This helps to reduce the overall weight and therefore increase the efficiency of e.g. vehicles which comprise an e-compressor with the housing provided according to the invention.

In order to provide a gas tight glass-to-metal seal, it may be advantageous if at least one conductor and the glass or glass-ceramic material form a compression seal. With a compression seal it is possible to provide a hermetical seal. Specifically, a He leakage rate of better then $1 \cdot 10^{-7}$ mbar l/s, especially $1 \cdot 10^{-8}$ mbar l/s for a pressure difference of 1 bar can be achieved by a compression seal. The term "compression seal" is commonly known. It generally means that the thermal expansion of the glass or glass-ceramic material is smaller than the thermal expansion of the surrounding material, so that, as the glass or glass-ceramic material solidifies when it is melted in the opening and the surrounding material so to say 'shrinks' onto the glass or glass-ceramic material and thereby exerts a permanent compressive stress on the glass or glass-ceramic material, which improves the mechanical pressure resistance.

In some embodiments the housing part comprises as a material steel, especially stainless steel, structural steel, optionally micro-alloyed steel, for example structural steel in form of micro-alloyed steel. Micro-alloyed steel is a type of alloy steel that contains small amounts of alloying elements (0.05 to 0.15%), including niobium, vanadium, titanium, molybdenum, zirconium, boron and rare-earth metals. They are used to refine the grain microstructure or facilitate precipitation hardening. The yield strength of micro-alloyed steel is between 275 and 750 MPa without heat treatment. Weldability is good and can even be improved by reducing carbon content while maintaining strength. Fatigue life and wear resistance are superior to similar heat-treated steels. Cold-worked micro-alloyed steels do not require as much cold working to achieve the same strength as other carbon steel; this also leads to greater ductility. By using micro-alloyed steel as material, a high bending stiffness and strength could be provided. The possible advantages of the usage of a micro-alloyed steel instead of a normal or structural steel is described previously herein.

In some embodiments, in order to position and/or mount the housing part to the housing, e.g. when used for an electric compressor, the housing part can comprise at least a protrusion. For mounting the housing part to the housing, the housing part can comprise at least one attachment bore such as a screw bore. In some embodiments the GTMS plate comprises two attachment and/or screw bores at the edges of the GTMS plate or the housing part. Such bores are not shown in the state of the art, e. g. KR 2019/094611 A1.

In some embodiments, the housing part has, in the area of the elevated plane and/or the recess area, a structure, which may advantageously enhance the surface area. This structure optionally is a stamped-in and/or reformed structure. Optionally, the structure has an undercut. This can be achieved by stamping and subsequent reforming.

In some embodiments the housing part comprises in the area of the openings a plastic and/or rubber material. The plastic and/or rubber material serves as further electrical insulation of the conductors which are fixed in or fed through the openings. This plastic and/or rubber can also contribute to reducing the risk of short currents, especially in case of wet or humid surroundings, when a water layer and/or dirt layer or the like might deposit on the surface of the glass or glass-ceramic material. Such a short circuit can occur in case, e.g. a film of a conductive material such as water wet the metal material of the housing and/or the conductor. Such a water film wetting the metal material as well as the conductor can occur in an e-compressor with an e-compressor terminal very easily. This is due to the fact that the e-compressor has a very low temperature e.g. of lower e.g. 5° C. or even negative temperatures, whereas the ambient temperature e.g. in the summertime, might be higher than 20° C. In such a case, a water film will be provided due to condensation. By additionally isolating the conductor from the metal material of the e-compressor housing, especially the cover in form of an e-compressor terminal, such short circuits due to conductive films can be prevented.

Figure 11:
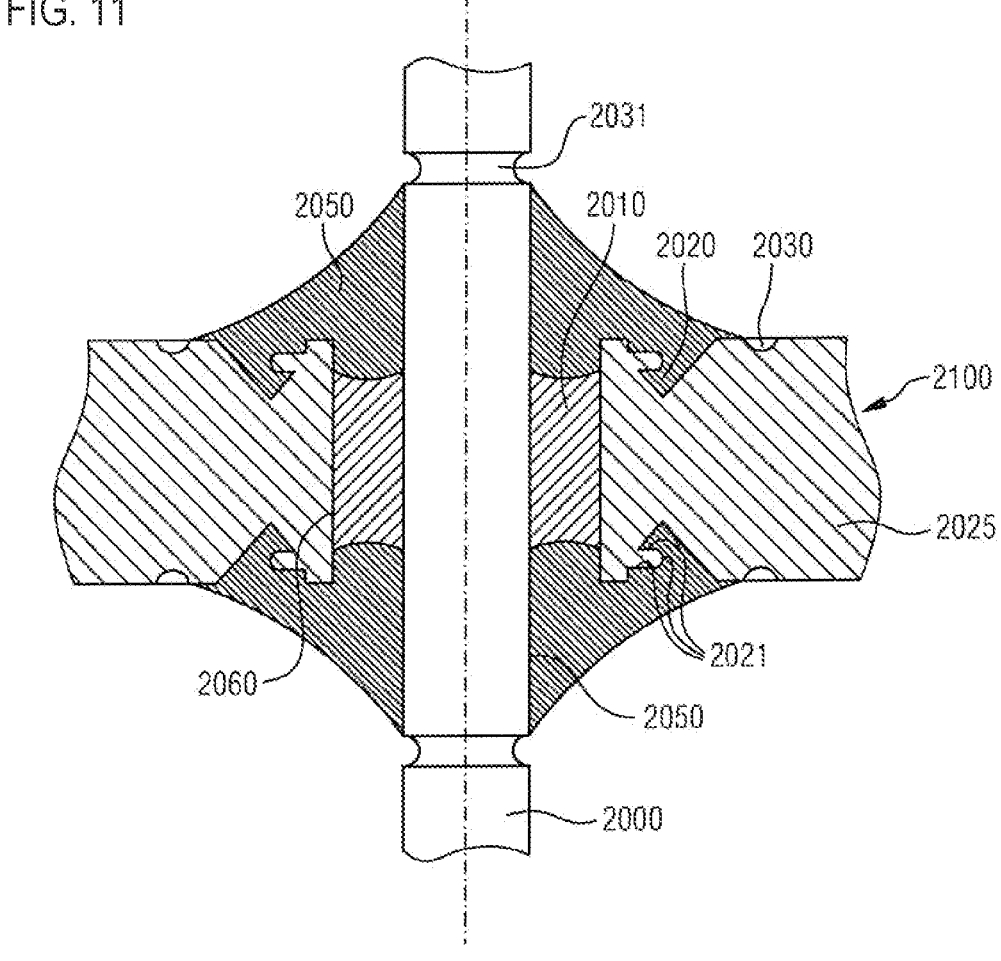
FIG. 11 is a side view of a housing part with a conductor fed through the opening and a ring embossing and/or ring shaped grooves.

The problem when providing a plastic and/or rubber and/or elastic material onto a metal material such as steel is, that due to the higher expansion coefficient of the plastic and/or rubber and/or elastic material, the plastic and/or rubber and/or elastic material will fall off from the metallic material. Then gaps between the metallic material and the plastic and/or rubber and/or elastic material result and diffusion can occur. In order to prevent this, the metal material can comprise a ring embossing with a groove in the metallic material. The plastic and/or rubber and/or elastic material can claw into those grooves. The grooves have the form of an undercut in which the plastic and/or rubber material can claw. Then a peeling off or taking off of the plastic and/or rubber and/or elastic material from the metallic material can be prevented and no gaps between the plastic and/or rubber and/or elastic material and the metallic material will occur. Ring shaped grooves 2030, 2031, as illustrated for example in FIG. 11, provide for a tight connection of the injection molding device and the metallic material. By the grooves 2030, 2031 the injection mold device which injects the plastic and/or rubber and/or elastic material can be sealed.

Optionally, at least a part of the structure of the elevated plane of the recess area has a roughness e.g. provided by a stamping or an embossing process for a casting compound which connects metal to an adhesive. The roughness can also be provided by a rolled textured sheet material or by a rolled texture with a stamping step by a tool. Due to the good adhesion, a safe connection between the metal material and a plastic and/or rubber and/or elastic material is provided. In order to improve the connection of the plastic and/or rubber material with the metal material, tenons and/or pins and/or spigots can be provided. Further, a ring embossing and/or ring shaped grooves can be formed to improve the adhesion of plastic and/or rubber material with the metal material. Such tenons can be formed from the sheet, eventually in form of a mushroom shaped head part. As described previously, a ring embossing around the glass material in which the conductor is fed through the metal material would be possible. In any case, by the structure of the metal material the connection of the plastic and/or rubber and/or elastic material with the metal of the e-compressor housing can be improved.

The housing can comprise opposite to the opening or the screw bores for centering the housing part, especially the GTMS plate, a bushing attached to the housing or the housing part, e.g. by welding or brazing.

The disclosed housing part or GTMS plate with a recess area and/or a screw bore and/or protrusions can be used for an e-compressor terminal. The e-compressor terminal is used in an electric compressor. Electric compressors or e-compressors are widely used in environmentally friendly vehicles to support the operation of the air conditioning system. Electric and hybrid vehicles are equipped with battery powered electric compressors. The electric compressors must be hermetically sealed and function with their own motor inside. E-Compressor terminals or feedthroughs are important components of electric compressors and must be designed and manufactured carefully for optimal performance. An e-compressor terminal enables the transfer of large amounts of energy from the battery to the air conditioning compressor, and at the same time must remain reliably gas-tight to prevent refrigerant leakage. Electric compressors have very high performance and durability requirements while also being subjected to harsh environmental conditions. These include high pressure, high humidity and vibration. Compressor terminals or feedthroughs must be able to withstand such adverse conditions without issue. Highly controlled and precise processes are necessary to provide long-term reliable gas-tightness. Moreover, the compressor terminals must deliver extremely high insulation resistance and high voltage capabilities to support future quick-charging technology developments. High current capabilities are also essential to enable upcoming 48V electrical systems. This can be achieved with the disclosed housing part when used in an e-compressor as an e-compressor terminal.

The disclosed housing part is optionally an e-compressor terminal. E-compressor terminals are important components of electric compressors and must be designed and manufactured to enable the transfer of large amounts of energy from the battery to the air conditioning compressor and at the same time remain reliably gas-tight to prevent any leakage, especially of refrigerant. Furthermore, electric compressors are affected by high pressure, high humidity and vibration.

Compressor terminals must be able to withstand such adverse conditions. Furthermore, a compressor terminal must have extremely high insulation resistance and high voltage capabilities for e. g. 48V electrical systems.

Referring now to the drawings, FIG. 1 is a cross-sectional view of a housing part 1, especially in a plate like form, which can be used as an e-compressor terminal with three conductors, 3.1, 3.2, 3.3, fed through three openings, 4.1, 4.2, 4.3. All three conductors 3.1, 3.2, 3.3 are fed through the openings 4.1, 4.2, 4.3 in a glass or glass-ceramic material 6.1, 6.2, 6.3 providing a glass metal seal (GTMS). The glass or glass-ceramic material 6.1, 6.2, 6.3 comprises, for example, a soda barium glass.

The material of the conductors 3.1, 3.2, 3.3 can, for example, be Cu, cored Fe—Cr, copper or Fe—Cr. The material of the housing part or the housing component is optionally steel, especially structural steel or stainless steel, optionally micro alloyed steel. The usage of micro-alloyed steel as material may have several advantages. One advantage is the higher stiffness and the higher yield strength. Furthermore a body of micro-alloyed steel provides for a lower weight than normal steel due to thinner wall thicknesses. Also under temperature e.g. in a glassing process, the yield strength and therefore stiffness of micro-alloyed steel is not so prominent reduced as in the case of structural steel.

The housing part 1 as shown in FIG. 1 further comprises two bores, especially screw bores 11.1, 11.2, comprising a screw 17 which is used for mounting and/or positioning the housing part, especially the e-compressor terminal in relation to the housing of the e-compressor. This is in contrast to the housing part for an e-compressor housing which is disclosed in KR 2019/0094611 A1, which does not show such bores. The centering of the housing part, especially the e-compressor terminal, to the housing of the e-compressor is provided by the two protrusions 9, which are part of the compressor housing. The housing also comprises two bores as well as the housing part.

Attached to the housing part are two bushings 12.1, 12.2 with a thread into which screws 17 are screwed. By this measurement the housing part, especially the e-compressor terminal can be attached to the housing, especially the compressor housing e.g. by screws. The bushings 12.1, 12.2 are welded in a gas-tight manner to the housing of the e-compressor.

Figure 2:
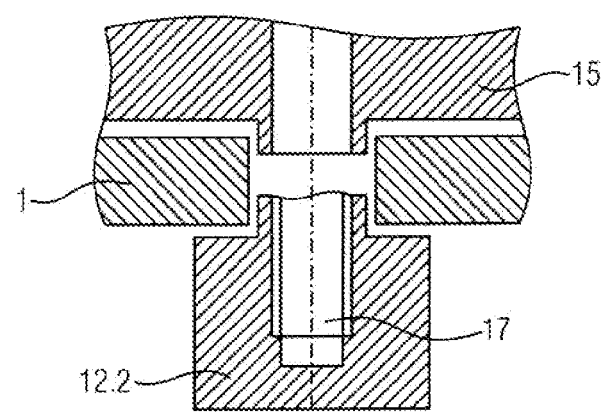
FIG. 2 is a more detailed view of a housing part according to FIG. 1 providing for centering and attaching the housing part to the housing with a screw.

FIG. 2 shows in detail the housing and the housing part 1 in form of an e-compressor terminal with one of the two bores, especially screw bores 11.2 at each side of the GTMS (glass metal seal) plate 1 through which a screw 17 is fed into the bushing 12.2. The bushing 12.2 is welded to the housing of the e-compressor in an air-tight manner. A screw 10.2 is fed through each of the screw bores 11.2 of the housing part 1 and fastened in said bushing so that the housing part, especially the e-compressor terminal 1 is fixed to the housing, especially the compressor housing 15 comprising the compressor tightly. As shown in FIG. 1, the housing 15 is centered to the housing part by protrusions 9 of the housing. The housing part is fastened to the housing by a screw 17 in the bore 11.2.

Figure 3:
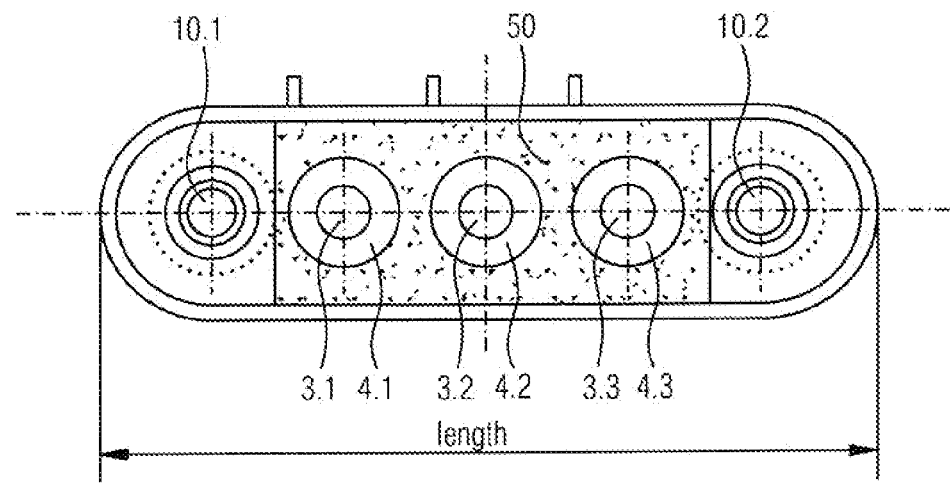
FIG. 3 is a top view of an e-compressor terminal with two bores, so-called screw bores and two protrusions according to FIG. 1.

FIG. 3 shows a top view of a housing part of an e-compressor terminal. Clearly it can be seen the screw bores 10.1, 10.2 as well as the three openings 4.1, 4.2, 4.3 through which the conductors 3.1, 3.2, 3.3 of the compressor terminal are fed. Through the screw bores screws are fed e.g. to a bushing and the housing part of an e-compressor and the e-compressor terminal is securely fixed to the housing, especially the e-compressor housing.

Further shown in FIG. 3 is an area 50 with a surface having a roughness for an adhesive or a casting compound to adhere a plastic and/or rubber and/or elastic material to the metal of the e-compressor terminal. The roughness can be provided by stamping or an embossing process. The area 50 is adjacent to the three openings 4.1, 4.2, 4.3 with the conductors 3.1, 3.2, 3.3 and provides for a better connection of a plastic and/or rubber and/or elastic material and the e-compressor terminal, which normally comprises a metal such as steel, stainless steel, optionally a structural steel especially a structural steel optionally in form of a micro-alloyed steel. In order to even better connect the plastic and/or rubber material to the metal of the e-compressor, terminal tenons can be provided or mushroom shaped head parts.

Figure 4:
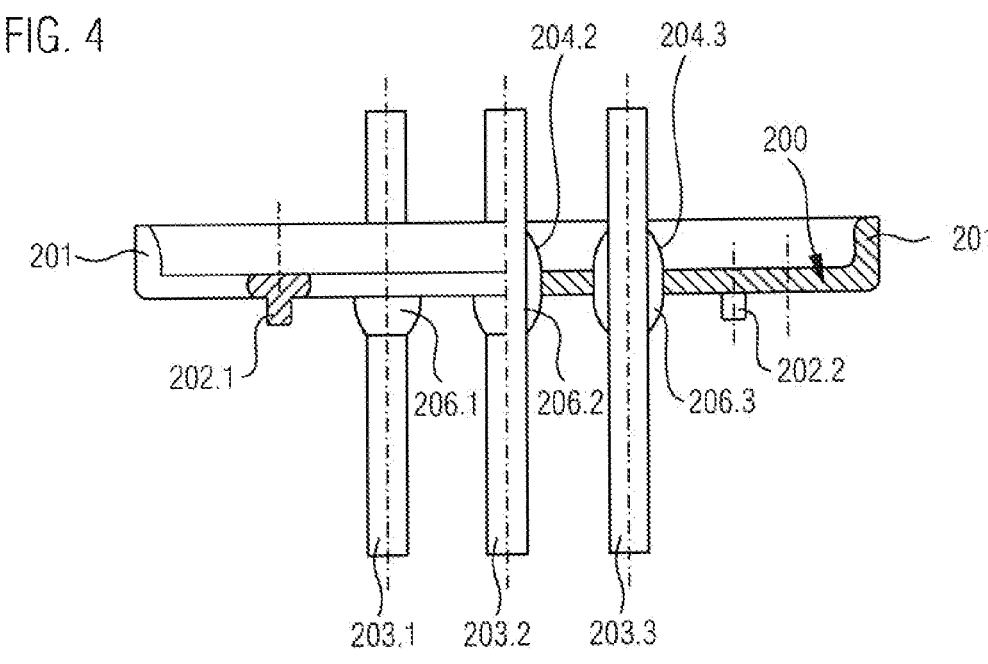
FIG. 4 is a cross-sectional view of an alternative embodiment of a housing part and two protrusions for centering the housing part to a housing, the housing part including a pulled up edge.

FIG. 4 is a cross sectional view through a housing part in another exemplary embodiment provided according to the invention with two bores and two protrusions 202.1, 202.2, which fit e.g. into two bores of the e-compressor housing. The protrusions serve only for centering the housing components to the e-compressor but not attaching the same to the housing e.g. by screws. The screw bores are separate from the centering bores as shown in FIG. 5.

Figure 5:
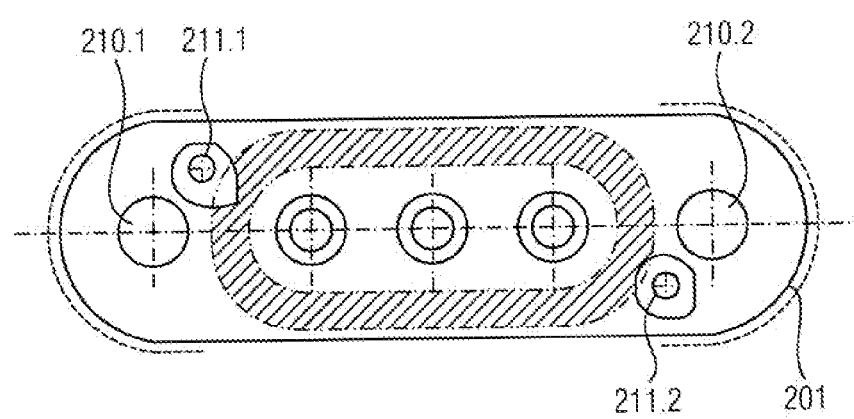
FIG. 5 is a top view of an e-compressor terminal with two bores and two protrusions according to FIG. 4.

In FIG. 5 the screw bores are denoted with reference number 210.1 and 210.2 and the protrusions with 211.1 and 211.2. As the embodiment of FIGS. 1 to 3, the housing part comprises three conductors 203.1, 203.2, 203.3 fed through three openings 204.1, 204.2, 204.3 of the housing part 200. As in FIG. 1, the housing part is in a plate like form but comprises edges in a pulled up form, so called pulled up edges 201. By the pulled up edge 201 the housing part provides for a higher stiffness and a higher pressure resistance. The pulled up edge 201 in the embodiment in FIGS. 4 and 5 surrounds the whole plate like element, especially the e-compressor terminal with the opening 204.1, 204.2, 204.3 through which the conductors 203.1, 203.2, 203.3 are fed. As can be seen from FIG. 4 and FIG. 5 the plate like part of the housing part, especially the e-compressor terminal and the pulled up edge 201 of the housing part are a one part element. This is possible if the pulled up edge is formed e.g. by a stamping or a forming process out of the plate like element.

Stamping or forming is a very cheap process for forming the pulled up edge 201. The height H of the pulled up edge 201 is optionally between 4 mm and 8 mm, such as 6 mm. The thickness D of the plate like element is between 1 mm and 3 mm, such as 1.5 mm or 2.5 mm. Each of the conductors 203.1, 203.2, 203.3 is fed through each of the openings molten in a glass material 206.1, 206.2, 206.3 which provides for a gas tight sealing, a so called pressure sealing.

Figure 6A:
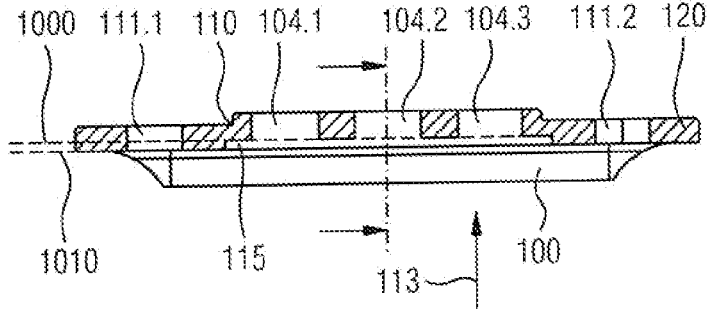
FIG. 6A is a cross-sectional view through a housing part in the form of an e-compressor terminal provided according to the invention, wherein a recess and an elevated area is formed by using a stamping process and the housing part comprises a pulled up edge, the recess and/or elevated area comprising all three opening through which the conductors are fed.
Figure 6B:
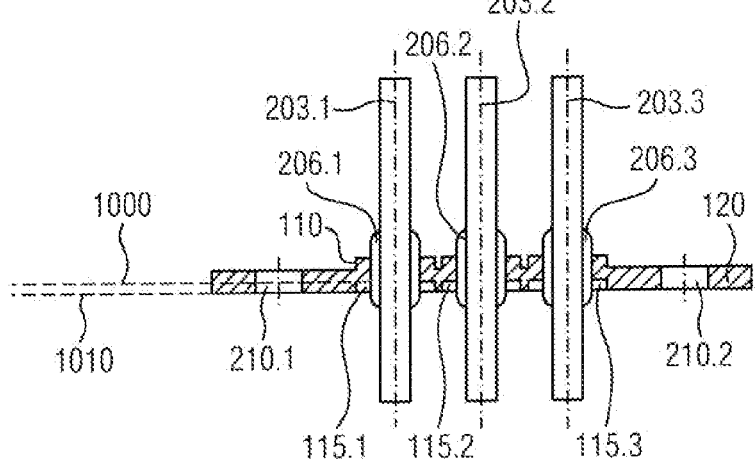
FIG. 6B is a cross sectional view through a housing part in the form of an e-compressor terminal provided according to the invention, wherein a recess and an elevated area is formed for each of the openings in contrast to FIG. 6A.
Figure 6B:
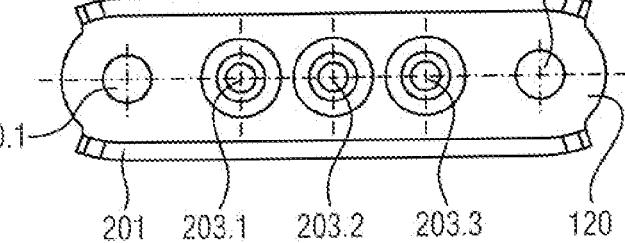

FIGS. 6A, 6A1 and 6B show another exemplary embodiment of the invention also in a cross-sectional view. The e-compressor terminal or housing part shown in FIGS. 6A, 6A1 and 6B has a pulled up edge 100 and a elevated area 110 or three elevated areas in FIG. 6B as well as recess areas 115, 115.1, 115.2, 115.3 formed into the plate like element 120 by e.g. a stamping process. The stamping process provides for both the elevated areas as well as the recess areas. Although by the stamping process the elevated area as well as the recess area is provided, the elevated area and the recess area do not necessarily have a complementary geometry. Especially the form of the side walls of the recess area and/or the elevated area can be different. Furthermore, each of the measurements the recess area as well as the elevated area provide for a higher stiffness and pressure resistance of the housing part. In all FIGS. 6A, 6A1 and 6B the different planes, the glassing plane 1000 as well as the plane 1010 which is attached e. g. by screws to an e-compressor housing are shown. As is apparent from FIGS. 6A, 6A1 and 6B the glassing plane or glassing area plane 1000 is different from the plane 1010 which is attached to an e-compressor housing, the so called base plane By this measurement, breakage of the glass material due to bending can be avoided. Especially mechanical stress and deformation in the recess area in which the feedthroughs comprising conductors in a glass or glass-ceramic material are provided, can be avoided. Therefore a loss of sealing capabilities and a reduction of long term stability of the e-compressor terminal can be avoided.

Further as shown in FIG. 6B, each feedthrough of the housing part could be provided with an elevated area and/or a recess area. Apart from the enhanced stiffness and/or pressure resistance, tensions in the glass material can be reduced. By reducing the tensions in the glass material, the risk of insulation problems can be reduced. These insulation problems arise when, due to tensions in the glass material, glass cracks in the glass material become more prominent. Glass cracks in such a case then lead to a low insulation. In contrast to the embodiment of FIGS. 4 and 5, the pulled up edge is only in the central part of the plate like element of FIGS. 6A and 6B as shown in FIGS. 10A1, 10A2, 10B, and 10C.

As can be seen in FIGS. 6A and 6A1, this embodiment also comprises three openings 104.1, 104.2, 104.3, through which conductors are fed. Further, as in FIG. 1, the plate like element comprises two bores 111.1, 111.2, through which a screw can be fed in order to position and fix the housing part, especially the e-compressor terminal to a housing, especially an e-compressor housing. The screw is not shown in FIGS. 6A and 6B. The screw bores of the embodiment in FIGS. 6A and 6B is not necessary for the centering of the housing part to the housing, e.g. the compressor housing. The centering is made in this embodiment by the elevated area or plateau area of the housing part or the GTMS plate. The screws are needed to fix the housing part to the e-compressor housing. The conductors which are fed through the openings 104.1, 104.2, 103.3 are not shown in FIGS. 6A and 6A1. The conductors not shown in FIGS. 6A and 6A1 are all embedded in a glass-material or a glass-ceramic material in each of the openings. The conductors and the glass or glass-ceramic material is only shown in FIG. 6B. The conductors are denoted in FIG. 6B by the reference numbers 203.1, 203.2, 203.3 and the glass or glass-ceramic material by 206.1, 206.2, 206.3. The glass or glass-ceramic material is also shown in FIG. 1 and denoted there by reference numbers 6.1, 6.2 and 6.3. Depending on the coefficient of expansion for the material, especially the metal surrounding the openings and the glass- or glass-ceramic material in the openings which surround the conductors, the feedthrough of the conductors can be a matched seal or a compression seal. Especially compression seals are hermetic seals, which means that the helium leakage rate is less than $1 \cdot 10^{-7}$ mbar 1/s, especially less than $1 \cdot 10^{-8}$ mbar 1/s for a pressure difference of 1 bar. The material of the housing with the openings 104.1, 104.2, 104.3 and the glass or glass-ceramic material in which the conductors are embedded are well known.

The direction of stamping the plate like element is denoted by 113. By stamping the plate like element, the elevated area and the plateau area 110 can easily be formed. The elevated area 110 is used for a centering of the housing part especially the plate like element or e-compressor terminal in relation to the e-compressor housing.

By the pulled up edge as well as the elevated area the stiffness of the plate like element could be enhanced. As can be seen from FIG. 7, which shows another cross section of the plate like element or the housing part, the complete housing part can be formed by a forming process, comprising inter alia stamping of the elevated area as well as forming the pulled up edge 100.

As described previously, the elevated area and the pulled up edge, the housing part, especially for an e-compressor, can provide for a higher stiffness and a higher pressure resistance.

In the embodiment shown in FIG. 6A, a recess area 115 is provided opposite to the elevated area 110. The elevated area 110 as well as the recess area 115 provides for a higher stiffness and pressure resistance. Each measurement, the elevated area or the recess area is responsible for an improved stiffness or pressure resistance.

In the embodiment according to FIG. 6A, the recess area and the elevated area comprises all three openings 104.1, 104.2, 104.3 and the recess area as well as the elevated area extends along all three openings without separation.

In order to better connect a rubber and/or plastic material to the metal material of the e-compressor terminal or housing part in FIG. 6A1, a mushroom shaped head part 1500 is provided. As shown in FIG. 7A, also tenons and/or pins and/or spigots 1510.1, 1510.2 in the side area of the pulled up edge 100 can be provided in order to improve the connection of rubber and/or plastic and/or elastic material to the metal material.

In some embodiments, each of the openings 104.1, 104.2, and 104.3 can have their own elevated and/or recess area. Such an embodiment is shown in FIG. 6B, FIG. 6B1 and FIG. 6B2. FIG. 6B is a cross-sectional view and FIG. 6B2 a top view. A side view which is denoted as FIG. 6B1 shows the pulled up edges 201 of this embodiment in which the recess areas 115.1, 115.2, 115 are associated to each opening with a glass or glass-ceramic material 206.1, 206.2, 206.3. The advantage of such an embodiment with recess areas and elevated areas associated to each opening is that the glass material does not show prominent cracks in the glass material and therefore the insulation may be improved over the embodiment of FIGS. 6A and 6A1. In the cross sectional view (FIG. 6B) as well as in the top and side view (FIG. 6B1, FIG. 6B2) the same components are denoted with the same reference numbers.

Figure 7:
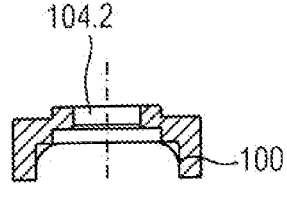
FIG. 7 is a cross-sectional side view of the housing part of FIG. 6A.
Figure 7A:
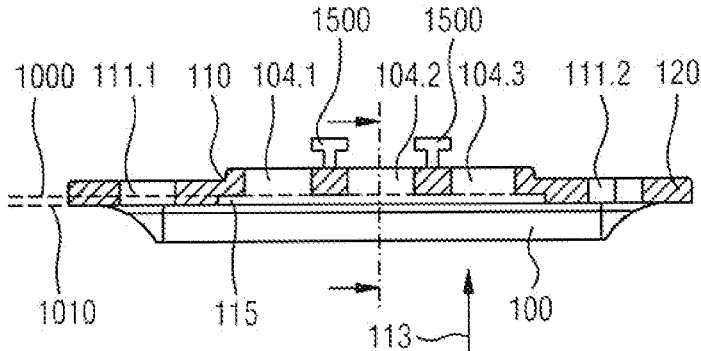
FIG. 7A is a cross-sectional side view of the housing part of FIG. 6A with tenons on the side wall for better connection of a plastic and/or rubber and/or elastic material with the material of the housing part.
Figure 7A:
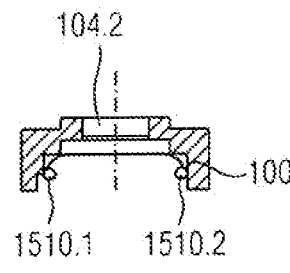

In FIG. 7 the same numbers are used for the same elements as in FIG. 6A. FIG. 7 shows the pulled up edge 100 as well as one opening 104.2 through which a conductor is fed. As material for the housing part, especially for an e-compressor terminal, steel is used. A stiffness about more than 15-30% higher than in common systems is reached, in case as a material for the housing part, a micro alloyed steel is used. Instead of micro-alloyed steel, normal steel or stainless steel can be used. FIG. 7A shows a pulled up edge 100 with tenons and/or pins and or spigots 1510.1, 1510.2 in order to improve the connection of rubber and/or plastic material with the metal.

Figure 8:
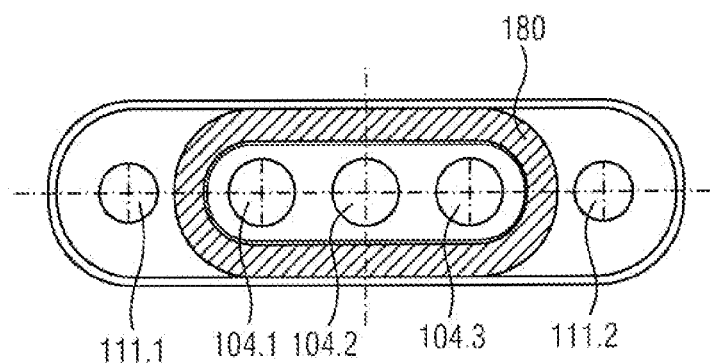
FIG. 8 is a view from below of the housing part of FIG. 6A.

FIG. 8 is a lower view of the housing part of FIGS. 6A and 7, especially for an e-compressor terminal. Equal elements as in FIGS. 6A and 7 are denoted with the same reference numbers. In FIG. 8, clearly shown are the three openings 104.1, 104.2, 104.3 as well as the bores 111.1, 111.2 through which screws for mounting the housing part to the housing e.g. an e-compressor are shown. In FIG. 8, the three openings 104.1, 104.2, 104.3 are surrounded by a seal area 180. In the seal area 180, a surface seal between the housing part, especially the e-compressor terminal and the housing, especially the e-compressor housing is provided. By the seal in the sealing area the e-compressor terminal or housing part can connected to the e-compressor housing in a tight manner.

Figure 9:
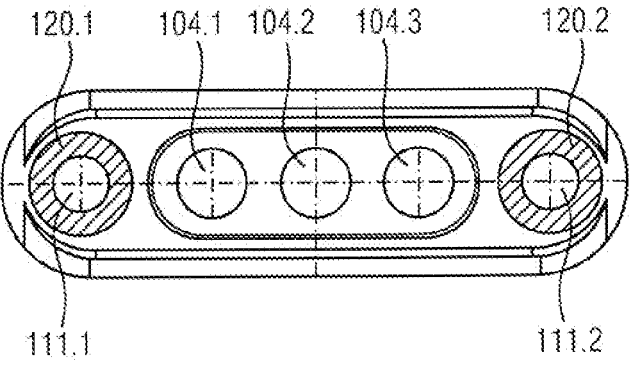
FIG. 9 is a top view of the housing part of FIG. 6A.
Figure 9:
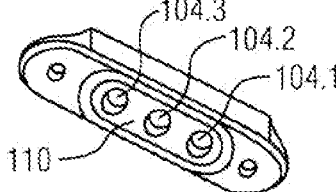
Figure 9:
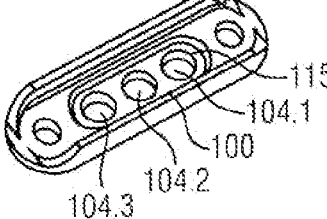

FIG. 9 shows the housing part for an e-compressor according to FIG. 6A, in an upper view onto which the housing part is attached. All three openings 104.1, 104.2, 104.3 for the conductors can be seen. Further to the openings 104.1, 104.2, 104.3, two bores 111.1, 111.2 for screws in order to attach the housing part, especially the e-compressor terminal, optionally in a plate-like form, to the housing of an e-compressor. The bores are denoted with reference numbers 111.1, 111.2. Each bore comprises an area 120.1, 120.2 which surrounds the bores 111.1, 111.2. These areas are flatness areas for the screw heads of the screws which are fed into the bores. The flatness areas prevent that when the screws are screwed down and/or screwed tight to affix the e-compressor or terminal to the e-compressor housing the e-compressor terminal in plate like form is not bend. The flatness area is a flat surface mainly received by an embossing process, especially an additional embossing process.

The flat area 120.1 and 120.1 is advantageously parallel to the seal area 180. The values for the parallelity are less than 0.1 mm and can be achieved due to the stamping process.

By the screws the housing part in a plate-like form comprising the openings through which the conductors are fed is attached to the housing of an e-compressor.

FIGS. 10A1 and 10A2 denote a 3D-picture of an e-compressor terminal according to FIG. 6A. What can be seen quite clearly is the pulled up edge, which provides for a higher stiffness of the element. Further as is apparent from FIGS. 10A1 and 10A2, the pulled up edge 100 of the embodiment of FIGS. 6A, 10A1, and 10A2 does not surround the whole plate like element like in FIGS. 4 and 5 but only the central part. Even if the pulled up edge is concentrated to the central part as in the embodiment of FIGS. 6A to 10C the stiffness of the plate like element can be enhanced sufficiently. The e-compressor terminal of FIGS. 10A1 and 10A2 can be connected in a tight manner to the housing of the e-compressor. Further, according to FIG. 6A the recess area 115 as well as the elevated area 110 extends over all openings 104.1, 104.2, 104.3.

Figure 10B:
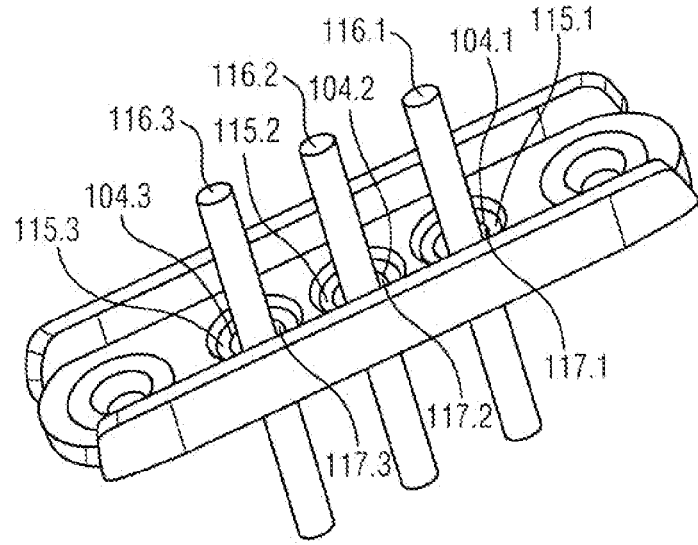
FIG. 10B is a 3D-view of the housing part of FIG. 6B.
Figure 10C:
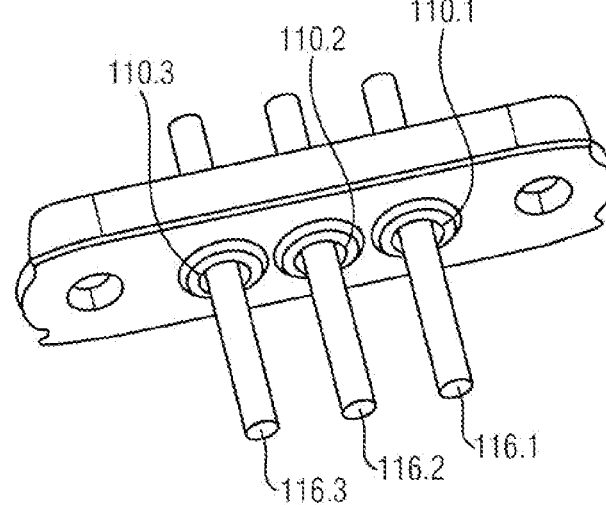
FIG. 10C is another 3D-view of the housing part of FIG. 6B.

FIGS. 10B and 10C are 3D-pictures of an e-compressor terminal according to FIGS. 6B, 6B1, and 6B2. In contrast to the embodiment shown in FIGS. 10A1 and 10A2, a recess area 115.1, 115.2, 115.3 as well as elevated area 110.1, 110.2 and 110.3 are associated to each of the openings 104.1, 104.2, 104.3. By this measurement the stiffness can be enhanced significantly and furthermore the glass material does not show cracks. In FIG. 10B the conductors 116.1, 116.2 and 116.3 are shown which are each fed in glass or glass-ceramic material 117.1, 117.2 and 117.3 through the openings 104.1, 104.2 and 104.3. The same components as before are denoted with the same number. In FIGS. 10B and 10C, it can be clearly seen that the recess areas 115.1, 115.2, 115.3 which provide for a higher stiffness are associated to each opening.

The glassing plane or glassing area of the conductors in the opening is denoted in FIG. 6B by 1000. This glassing plane is clearly different from the plane, especially the base plane 1010, in which the e-compressor terminal is attached to the e-compressor housing e.g. by screws which are led through bores in the e-compressor terminal plate.

FIG. 11 shows a conductor 2000 in an opening 2010 of e. g. an e-compressor terminal as described previously with a ring embossing 2020 in the metal material 2025 and/or ring shaped grooves 2030 in the metal material 2025 for connecting a plastic and/or rubber and/or elastic material 2050 to the metal of the conductor and/or housing 2100. The glass material through which the conductor 2000 is fed through the opening 2010 is denoted by 2060. The plastic and/or rubber and/or elastic material 2050 is necessary to prevent a short circuit between the conductor 2000 and the metal material 2025 although the glass material is an isolator. Such a short circuit can occur in case, e.g. a film of a conductive material such as water, wet the metal material 2025 of the housing and/or the conductor. Such a water film wetting the metal material as well as the conductor can occur in an e-compressor with an e-compressor terminal very easily. This is due to the fact that the e-compressor has a very low temperature e.g. of lower e.g. 5° C. or even negative temperatures, whereas the ambient temperature e.g. in the summertime might be higher then 20° C. In such a case, a water film will be provided due to condensation. By additionally isolating the conductor 2000 from the metal material 2025 of the e-compressor housing, especially the cover in form of an e-compressor terminal, such short circuits due to conductive films can be prevented.

The problem providing a plastic and/or rubber and/or elastic material onto a metal material such as steel is that due to the higher expansion coefficient of the plastic and/or rubber and/or elastic material the material will flake off or fall off from the metallic material. Then gaps between the metallic material and the plastic and/or rubber and/or elastic material result and diffusion can occur. In order to prevent this, the metal material can comprise at least a groove 2021 having an undercut in the metallic material. The plastic and/or rubber and/or elastic material can then claw into the undercut of the grooves 2021. Then a flake off of the plastic and/or rubber and/or elastic material from the metallic material can be prevented and no gaps between the plastic and/or rubber and/or elastic material and the metallic material will occur.

As described previously, an undercut of the groove 2021 allows the plastic material to crawl into the groove and thereby provides a mechanical measure to prevent the plastic material from being pulled-off in a direction parallel to the conductor. Further, the plastic material shrinks onto the metal and provides for a tight connection between the grooves or undercut and the plastic material itself.

Optional grooves 2030, 2031 provide for a tight connection of the injection mold device and the metal material. The injection mold device injects the plastic and/or rubber and/or elastic material.

The disclosed housing part provides for an improved stiffness and pressure resistance as well as a housing part which can be centered easily, e.g. to the housing to which the housing part should be attached. Further, the invention provides a tight seal between the housing part and the housing to which the housing part is attached due to the high evenness. Furthermore, a tight feedthrough of the conductors in a glass or glass-ceramic material is provided. Furthermore, the housing part has a high yield strength. The pressure resistance of the housing part in the form of a cover is very high and therefore the housing part is tightly connected to the e-compressor housing. Further, cracks in the glass material which surround the conductors can be avoided.

The following paragraphs describe some exemplary embodiments provided according to the invention.

In some embodiments provided according to the invention, a housing part 1, especially a plate like element, for the attachment to a housing, optionally an e-compressor terminal, includes at least one opening 4.1, 4.2, 4.3 for at least one conductor (3.1, 3.2, 3.3) embedded in a glass or a glass-ceramic material 6.1, 6.2, 6.3 that is fed into each of the respective openings providing a glass-metal seal (GTMS). The housing part 1 comprises means for centering the housing part 1 within a structure of the housing means for enhancing the resilience against bending, wherein the means for centering the housing part 1 are represented by a recess area 110 and/or at least two bores 11.1, 11.2. In some embodiments, the housing part comprises a pulled up edge 100. In some embodiments, the housing part comprises a plurality of openings 4.1, 4.2, 4.3, wherein the housing part 1 forms an elongated structure.

In some embodiments, the housing part comprises as a material steel, especially stainless steel, structural steel, micro alloyed steel, and/or structural steel in form of micro-alloyed steel.

In some embodiments, the recess area 110 and/or the pulled up edge 100 is formed by using a stamping or reforming process, wherein the recess area 110 and/or the pulled up edge and the housing part 1 are a one-piece part.

In some embodiments, the recess area 110 represents a plane which is elevated from the plane of the base of the housing part 1, whereas the recess area 110 has a side wall which extends from the base of the housing part 1, and wherein the transition of the base of the housing part 1 side wall is rounded, optionally with a radius R between 0.01 mm and 0.8 mm.

In some embodiments, the pulled up edge 100 is a separate part, which is joined with the housing part by fusing.

In some embodiments, the housing part is reshaped in order to provide the pulled up edge 100.

In some embodiments, the recess area 110 has, at least at the side to be connected to the housing, a flatness according to ISO 1101 of at least 0.1, optionally at least 0.07 or from 0.01 to 0.07.

In some embodiments, the at least one conductor 3.1, 3.2, 3.3 and the glass or glass-ceramic material 6.1, 6.2, 6.3 form a compression seal.

In some embodiments, the housing part comprises at least one attachment bore 11.1, 11.2, optionally for positioning and/or mounting the housing part.

In some embodiments, at least an area of the elevated plane of the recess area 110 has a structure, optionally a stamped-in and/or reformed structure; in some embodiments, the structure has an undercut.

In some embodiments, the area 120.1, 120.2 of the openings comprises a plastic material, optionally the plastic material covers at least a part of the structure of the elevated plane of the recess area 110; the plastic material may extend into the undercut.

In some embodiments, an electric compressor comprises the previously described housing part in the form of an e-compressor terminal.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A housing part for attachment to a housing, the housing part comprising:

at least one opening for at least one conductor embedded in a glass or a glass-ceramic material that is fed into the at least one opening providing a glass-metal seal (GTMS);

an elevated area and/or a recess area configured to center the housing part within a structure of the housing and/or enhance the resilience against bending, wherein the at least one opening is provided in the elevated area and/or the recess area, wherein the elevated area and/or the recess area is situated in a glassing area plane; and at least two bores situated in a plane different from the glassing area plane, wherein an entryway of the at least one opening is situated in a first glassing area plane and an entryway of each of the at least two bores is situated in a plane different from the first glassing area plane, the respective entryways being located at a first side of the housing part, and wherein an exit of the at least one opening is situated in a second glassing area plane and an exit of each of the at least two bores is situated in a plane different from the second glassing area plane, the respective exits being located at an opposite second side of the housing part.

2. The housing part of claim 1, further comprising a pulled up edge.

3. The housing part of claim 1, wherein the housing part comprises a plurality of openings and/or the housing part forms an elongated structure.

4. The housing part of claim 1, wherein the housing part comprises a material that is at least one of steel, stainless steel, structural steel, micro-alloyed steel, or structural steel in the form of micro-alloyed steel.

5. The housing part of claim 1, wherein the housing part comprises the elevated area and the elevated area represents a plane which is elevated from a plane of a base of the housing part, wherein the elevated area has a side wall which extends from the base of the housing part, and wherein a transition of the base of the housing part to the side wall is rounded.

6. The housing part of claim 1, wherein the elevated area and/or the recess area has, at least at a side to be connected to the housing, a flatness according to ISO 1101 of at least 0.1.

7. The housing part of claim 1, wherein the at least one conductor and the glass or glass-ceramic material form a compression seal.

8. The housing part of claim 1, further comprising at least one attachment bore.

9. The housing part of claim 1, wherein the housing part comprises the elevated area and at least an area of an elevated plane of the elevated area has a structure.

10. The housing part of claim 1, further comprising an area with a roughness for a casting compound and/or an adhesive and/or an area which provides for a seal between the housing part and the housing.

11. The housing part of claim 1, further comprising tenons and/or pins and/or mushroom shaped head parts and/or a ring embossing and/or ring shaped grooves configured to connect plastic and/or rubber material to material of the housing part.

12. The housing part of claim 1, wherein a flatness area surrounds the at least two bores.

13. The housing part of claim 1, further comprising a groove, wherein the groove is situated around at least the at least one opening with the conductor embedded in a glass- or glass-ceramic material.

14. The housing part of claim 1, wherein the at least one opening defines a single respective cross-sectional area and each of the at least two bores defines a single respective cross-sectional area.

15. The housing part of claim 2, wherein the elevated area and/or the recess area and/or the pulled up edge is formed by using a stamping or reforming process, wherein the elevated area and/or the recess area and/or the pulled up edge and the housing part are a one-piece part.

16. The housing part of claim 2, wherein the pulled up edge is a separate part that is joined with the housing part by fusing.

17. The housing part of claim 2, wherein the housing part is reshaped in order to provide the pulled up edge.

18. The housing part of claim 5, wherein the transition has a radius R that is between 0.01 mm and 0.8 mm.

19. The housing part of claim 13, wherein the groove is filled with a plastic or rubber or elastic material.

20. An electric compressor, comprising:

a housing part for attachment to a housing, the housing part comprising:

at least one opening for at least one conductor embedded in a glass or a glass-ceramic material that is fed into the at least one opening providing a glass-metal seal (GTMS);

an elevated area and/or a recess area configured to center the housing part within a structure of the housing and/or enhance the resilience against bending, wherein the at least one opening is provided in the elevated area and/or the recess area, wherein the elevated area and/or the recess area is situated in a glassing area plane; and at least two bores situated in a plane different from the glassing area plane, wherein an entryway of the at least one opening is situated in a first glassing area plane and an entryway of each of the at least two bores is situated in a plane different from the first glassing area plane, the respective entryways being located at a first side of the housing part, and wherein an exit of the at least one opening is situated in a second glassing area plane and an exit of each of the at least two bores is situated in a plane different from the second glassing area plane, the respective exits being located at an opposite second side of the housing part.

* * * * *